(12) United States Patent
Aiba et al.

(10) Patent No.: US 7,138,723 B2
(45) Date of Patent: Nov. 21, 2006

(54) DEFORMABLE SEMICONDUCTOR DEVICE

(75) Inventors: Kazuyuki Aiba, Kawasaki (JP); Akira Takashima, Kawasaki (JP); Kaname Ozawa, Kawasaki (JP); Tetsuya Hiraoka, Kawasaki (JP); Takaaki Suzuki, Kawasaki (JP); Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/006,664

(22) Filed: Dec. 8, 2004

(65) Prior Publication Data

US 2005/0082684 A1 Apr. 21, 2005

Related U.S. Application Data

(63) Continuation of application No. PCT/JP02/08193, filed on Aug. 9, 2002.

(51) Int. Cl.
*H01L 23/31* (2006.01)
*H01L 25/065* (2006.01)
*H01L 29/06* (2006.01)
*H01L 23/28* (2006.01)
*H01L 29/02* (2006.01)

(52) U.S. Cl. ............... 257/778; 257/E23.092; 257/E25.011; 257/E29.022; 257/E25.013; 257/737; 257/738; 257/773; 257/795; 257/779; 257/793; 361/748; 361/764

(58) Field of Classification Search ........ 257/778–780, 257/793, 795, 777, 773, 686, 685, 784, 786, 257/787, 678, 698, E23.092, E25.011, E29.022, 257/E25.013, 737, 738; 361/748, 764; 174/255, 174/52.4

See application file for complete search history.

(56) References Cited

U.S. PATENT DOCUMENTS

| | | | |
|---|---|---|---|
| 6,255,599 B1 * | 7/2001 | Chang et al. | 174/255 |
| 6,303,998 B1 * | 10/2001 | Murayama | 257/778 |
| 6,392,143 B1 * | 5/2002 | Koshio | 174/52.4 |
| 6,448,665 B1 * | 9/2002 | Nakazawa et al. | 257/789 |
| 6,518,666 B1 * | 2/2003 | Ikeda | 257/738 |
| 6,664,644 B1 * | 12/2003 | Morozumi | 257/777 |
| 6,756,685 B1 * | 6/2004 | Tao | 257/778 |
| 6,888,238 B1 * | 5/2005 | Li | 257/706 |
| 6,949,404 B1 * | 9/2005 | Fritz et al. | 438/106 |
| 2001/0049155 A1 | 12/2001 | Yamaji | 438/106 |
| 2004/0104463 A1 * | 6/2004 | Gorrell et al. | 257/686 |

FOREIGN PATENT DOCUMENTS

| | | |
|---|---|---|
| JP | 1-244625 | 9/1989 |
| JP | 6-244243 | 9/1994 |
| JP | 11-345823 | 12/1999 |
| JP | 2000-31316 | 1/2000 |
| JP | 2001-118982 | 4/2001 |
| JP | 2001-352032 | 12/2001 |

* cited by examiner

*Primary Examiner*—Alexander Oscar Williams
(74) *Attorney, Agent, or Firm*—Westerman, Hattori, Daniels & Adrian, LLP.

(57) ABSTRACT

A semiconductor chip is secured in a state deformed into a substantially cylinder shape by a coating material formed on its surface. The deformed semiconductor chip is flip-chip connected to an interposer and sealed with sealing resin onto the interposer. Solder balls are provided, as external terminals, on the other side of the interposer.

2 Claims, 20 Drawing Sheets

DATA INPUT CIRCUIT/
WRITE CIRCUIT
19, 15

READ CIRCUIT/
DATA OUTPUT CIRCUIT
20, 16

MEMORY ARRAY

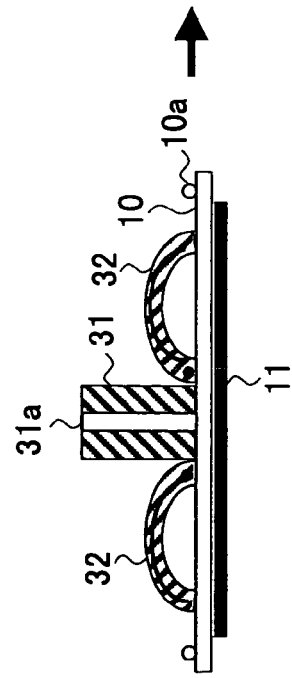
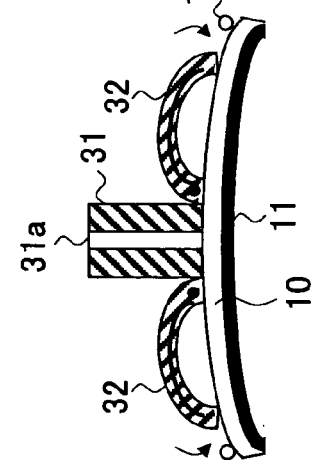
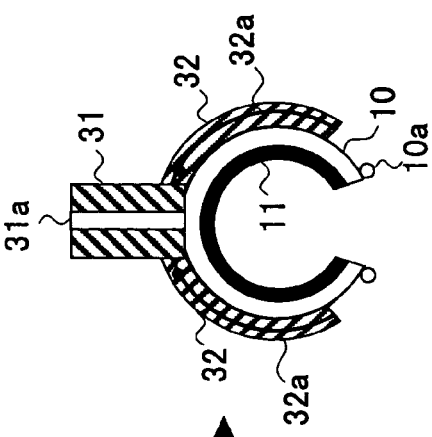

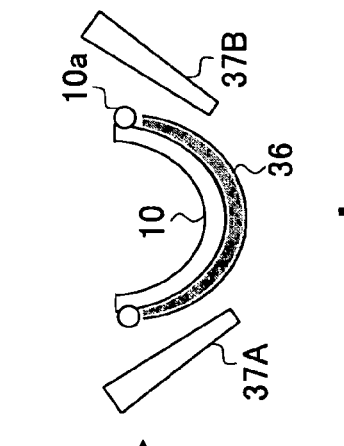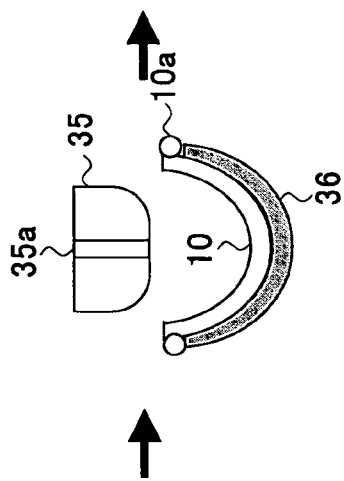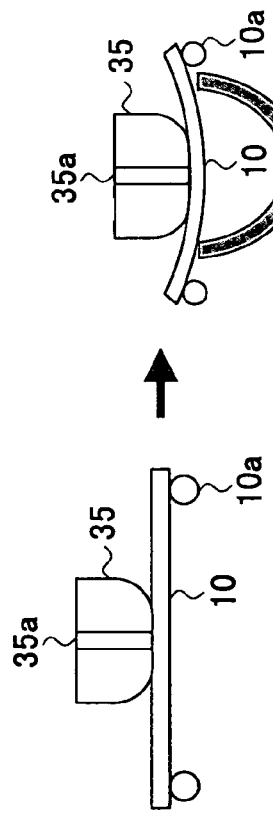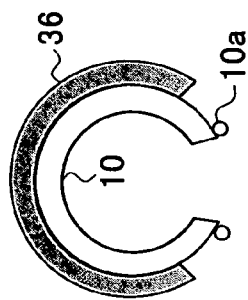

DEFORMABLE SEMICONDUCTOR DEVICE

CROSS REFERENCE TO RELATED APPLICATIONS

This application is a U.S. continuation application filed under 35 USC 111(a) claiming benefit under 35 USC 120 and 365(c) of PCT application JP2002/008193, filed Aug. 9, 2002, which is incorporated herein by reference in its entirety.

BACKGROUND OF THE INVENTION

1. Field of the Invention

The present invention relates generally to a semiconductor device, and particularly to a semiconductor device having a bent or curved semiconductor element such as a stacked multi-chip package (MCP) and a multi-chip module (MCM), for example.

2. Description of the Related Art

Presently, attention is being directed to a technique for deforming a flat semiconductor chip into a desired shape for mounting in order to increase integration and operational speed of a semiconductor device. As technology develops for manufacturing a thinner semiconductor chip, it is becoming increasingly easier to deform (bend) the semiconductor chip itself into a desired shape. Japanese Laid-Open Patent Publication No. 2001-118982 and Japanese Laid-Open Patent Publication No. 11-345823 disclose technologies for deforming (bending) and mounting a semiconductor element.

FIG. 1 is a perspective view showing a configuration of a deformed semiconductor chip that is described in Japanese Laid-Open Patent Publication No. 2001-118982. The semiconductor chip 1 shown in this drawing is wrapped around a cylinder-shaped support substrate 2 to be deformed into a cylinder shape. In this drawing, electrode pads 1a of the semiconductor chip 1 are arranged in a longitudinal direction with respect to the cylinder shape and these electrode pads 1a may be used to interconnect to another similar cylindrically deformed semiconductor chip.

FIG. 2 is a side view showing a configuration of a deformed semiconductor chip that is described in Japanese Laid-Open Patent Publication No. 11-345823. One side of the semiconductor chip 3 shown in this drawing has solder bumps 3a mounted thereon as external connection electrodes, and the semiconductor chip 3 is deformed in a manner such this side forms a concave surface. The solder bumps 3a are connected to a wiring portion 4a of an interposer 4. According to this configuration, even when the interposer 4 is thermally deformed, stress created between the semiconductor chip 3 and the interposer 4 (i.e, at the solder bumps 3a) may be alleviated since the semiconductor chip may easily deform (bend).

However, in the example of FIG. 1, the semiconductor chip 1 is wrapped around a cylindrical substrate 2, and thereby, the weight of the semiconductor device may increase. Also, depending on the connection state of the chips (e.g., when the chips wrapped around a cylinder structure are mounted on top of each other), the chips that are to be mounted may need to be interconnected, and thereby the pads of the chips may have to be adjusted. Consequently, redesigning of the chip structure may be required, and the conventional semiconductor chip may not be used in its present form. Also, the semiconductor chip 1 has to be precisely wrapped around the cylinder substrate 2, and in turn measures for realizing such effect need to be contemplated.

Also, when a semiconductor chip is deformed and flip chip mounted as in the case of semiconductor chip 3 of FIG. 2, the chip is thin and lacks strength so that a crack may be generated upon connecting the chip to the interposer or sealing the structure with resin, for example. Further, since the semiconductor chip is deformed into an arc shape, the positioning accuracy of the connection portion between the interposer and the semiconductor chip may be low.

SUMMARY OF THE INVENTION

It is a general object of the present invention to provide an improved and effective semiconductor device that solves one or more of the above-described problems of the related art and a method for manufacturing such a semiconductor device.

A more specific object of the present invention is to provide a semiconductor device that uses one or more thin semiconductor chips and to deform the semiconductor chips so that the semiconductor chips may be arranged in a spatially-efficient manner.

In one aspect of the present invention, a semiconductor device is provided that includes at least one semiconductor chip, a setting member that is formed on a surface of the semiconductor chip and is configured to set the semiconductor chip into a deformed shape corresponding to a substantially cylinder shape or a curved shape, a package substrate to which the deformed semiconductor chip is flip chip connected, a sealing resin that seals the semiconductor chip onto the package substrate, and an external connection terminal that is provided on the package substrate.

In a semiconductor device according to an embodiment of the present invention, the deformed shape of a semiconductor chip may be maintained by the setting member, and the semiconductor chip may be flip chip connected to the package substrate in its present state. The setting member may also function as a strengthening member for preventing cracking of the semiconductor chip. By deforming the semiconductor chip into a cylinder shape or a curved shape, a small package substrate may be used compared to a case in which a flat semiconductor chip is used, and thereby, the horizontal projected area of the semiconductor device may be reduced. By suitably mounting plural deformed semiconductor chips, the space provided on the package substrate may be efficiently used and the packaging density of the semiconductor device may be increased. Also, the semiconductor device may be deformed to change the position of the external connection electrode pads to a suitable position, and thereby, wiring for the package substrate may be shortened and a semiconductor device with high operational speed may be realized.

According to a preferred embodiment of the present invention, the setting member corresponds to a resin layer that is formed on an inner side surface of the substantially cylinder shaped or curve shaped semiconductor chip. Also, to facilitate deformation of the semiconductor chip, the thickness of the semiconductor chip is preferably no more than 50 µm.

Further, a semiconductor device according to an embodiment of the present invention may include plural semiconductor chips that are flip chip connected to each other. In one embodiment, the plural semiconductor chips may include a first substantially cylinder shaped semiconductor chip, and a second substantially cylinder shaped semiconductor chip having a diameter that is greater than that of the first semiconductor chip, the second semiconductor chip being arranged around the outer periphery of the first semiconductor chip. In one embodiment, an end portion of the first semiconductor chip may protrude and extend from an end portion of the second semiconductor chip and the first semiconductor chip and the package substrate may be flip chip connected. In another embodiment, the plural semiconductor chips may include a first curve shaped semiconductor chip, and a second curve shaped semiconductor chip having a greater curve dimension than that of the first semiconductor chip, the second semiconductor chip being arranged around the outer periphery of the first semiconductor chip. In one embodiment, an end portion of the second semiconductor chip may be arranged to extend beyond an end portion of the first semiconductor chip, and the second semiconductor chip and the package substrate may be flip chip connected.

A semiconductor device according to an embodiment of the present invention may include plural curve shaped semiconductor chips in different sizes. In one embodiment, a smaller-sized semiconductor chip may be arranged to be accommodated within a space created by the curved shape of a larger-sized semiconductor chip. According to another embodiment, the plural semiconductor chips may be individually flip chip connected to the package substrate. In yet another embodiment, a smaller-sized semiconductor chip may be flip chip connected to a larger-sized semiconductor chip, and the larger semiconductor chip may be flip chip connected to the package substrate.

Also, a semiconductor device according to an embodiment of the present invention may include plural flat semiconductor chips that are layered, and a deformed semiconductor chip that is flip chip connected to the package substrate and an uppermost semiconductor chip layer of the flat semiconductor chip layers having a circuit formation surface that is facing upward.

The present invention according to another aspect provides a method for manufacturing a semiconductor device having a deformed semiconductor chip, the method including the steps of supporting a flat semiconductor chip, applying a liquid resin on a surface of the flat semiconductor chip, deforming the flat semiconductor chip in a manner such that the resin-applied surface of the semiconductor chip forms an inner side of the deformed semiconductor chip, hardening the liquid resin and setting the semiconductor chip into a substantially cylinder shape or a curved shape, and flip chip mounting the semiconductor chip to a package substrate. In one embodiment of a semiconductor device manufacturing method according to the present invention, the step of applying liquid resin may be conducted after deforming the semiconductor chip.

It is noted that other objects, features and advantages of the present may become more apparent from the description of preferred embodiments of the present invention presented below with reference to the accompanying drawings.

BRIEF DESCRIPTION OF THE DRAWINGS

FIGS. 9A, 9B, and 9C are diagrams illustrating the operation of the deformation jig shown in FIG. 8;

FIGS. 11A~11E are diagrams illustrating the process of deforming a semiconductor chip into a cylinder shape using the deformation jigs shown in FIGS. 10A~10C;

DESCRIPTION OF THE PREFERRED EMBODIMENTS

In the following, preferred embodiments of the present invention are described with reference to the accompanying drawings.

Figure 1:
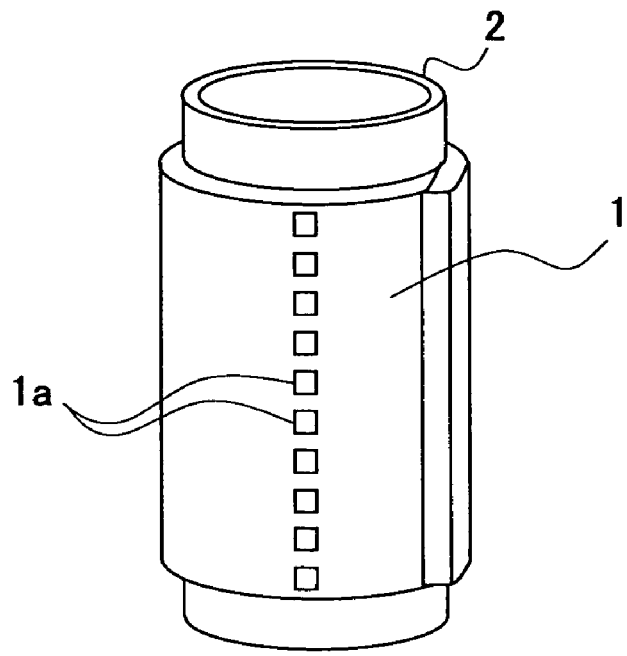
FIG. 1 is a perspective view of a cylindrically deformed semiconductor chip according to a prior art example.
Figure 2:
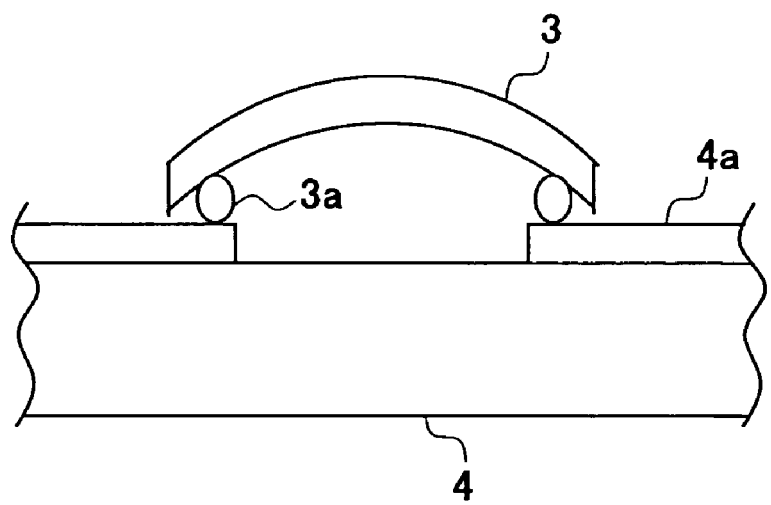
FIG. 2 is a side view of a semiconductor chip that is mounted on a substrate in a curved state according to another prior art example.
Figure 3:
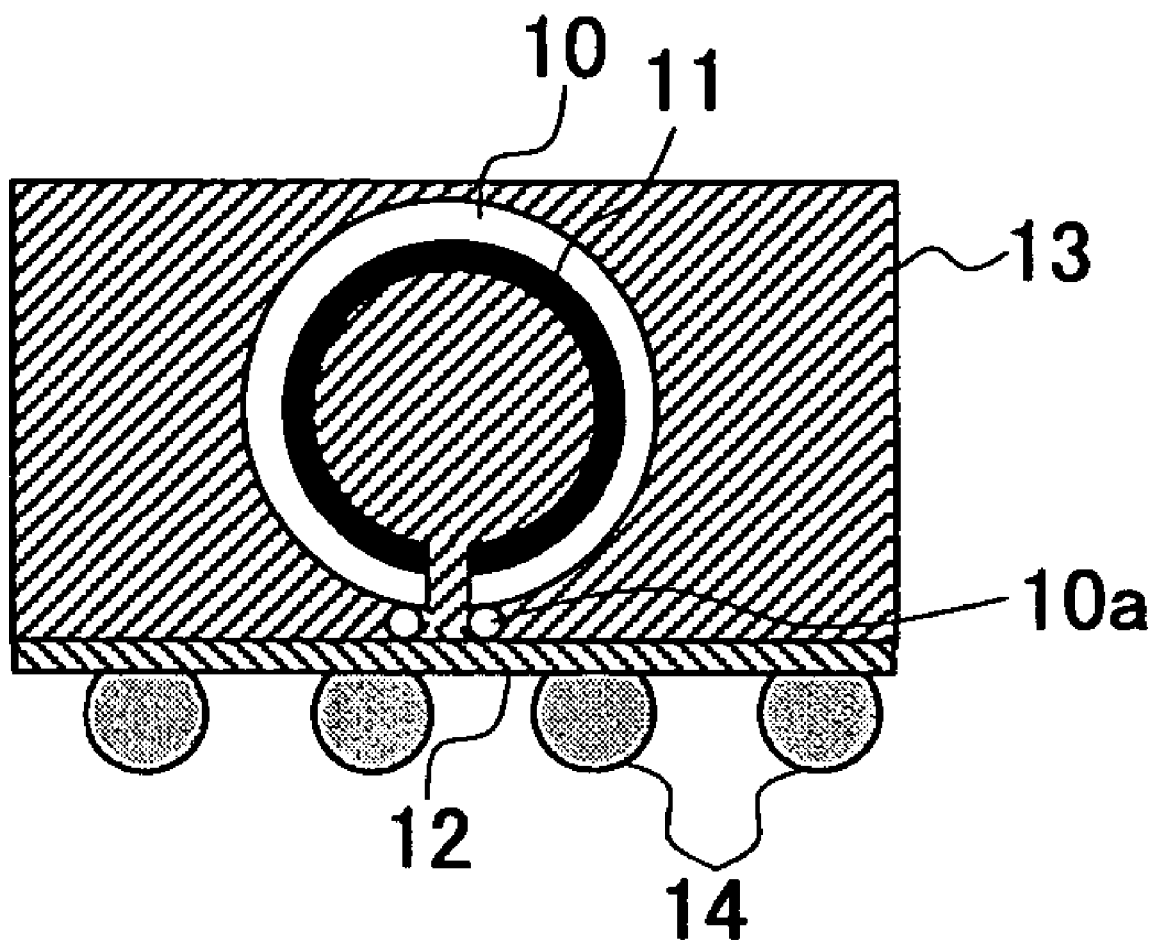
FIG. 3 is a cross-sectional view of a semiconductor device according to a first embodiment of the present invention.

FIG. 3 is a cross-sectional diagram showing a semiconductor device according to a first embodiment of the present invention. The semiconductor device shown in FIG. 3 includes a semiconductor chip 10 that is bent into a substantially cylinder structure. The semiconductor chip 10 is bent in a manner such that bumps 10a as external connection terminals face outward. The bumps 10a may be made of solder or gold, for example. The bumps 10a, which are provided at the outer edges of the semiconductor chip 10, are aligned into two rows that extend in the longitudinal direction with respect to the cylinder structure. On the other side of the semiconductor chip 10 (at the inner side of the cylinder structure), coating material 11 such as resin is applied as a setting member. In this way, the cylinder structure of the semiconductor chip 10 may be retained by the resin layer.

In the present example, the semiconductor chip 10 is connected to a package substrate (interposer) 12 via the bumps 10a. More specifically, bumps 10a of the semiconductor chip 10 are flip chip connected to the interposer 12. The semiconductor chip 10 is sealed onto the interposer 12 by a sealing resin 13. At the outer side of the interposer 12, solder balls 14 are provided as external connection terminals of the semiconductor device.

In a case where the semiconductor chip 10 is shaped into a cylinder structure as in the present example, the thickness of the semiconductor chip 10 is arranged to be relatively thin, preferably less than or equal to 50 μm.

When a semiconductor chip 10 is cylinder shaped, the size of the interposer 12 to be implemented may be smaller compared to a case in which the semiconductor chip 10 has a flat configuration. In this way, the horizontal projected area of the semiconductor device may be reduced.

Figure 4:
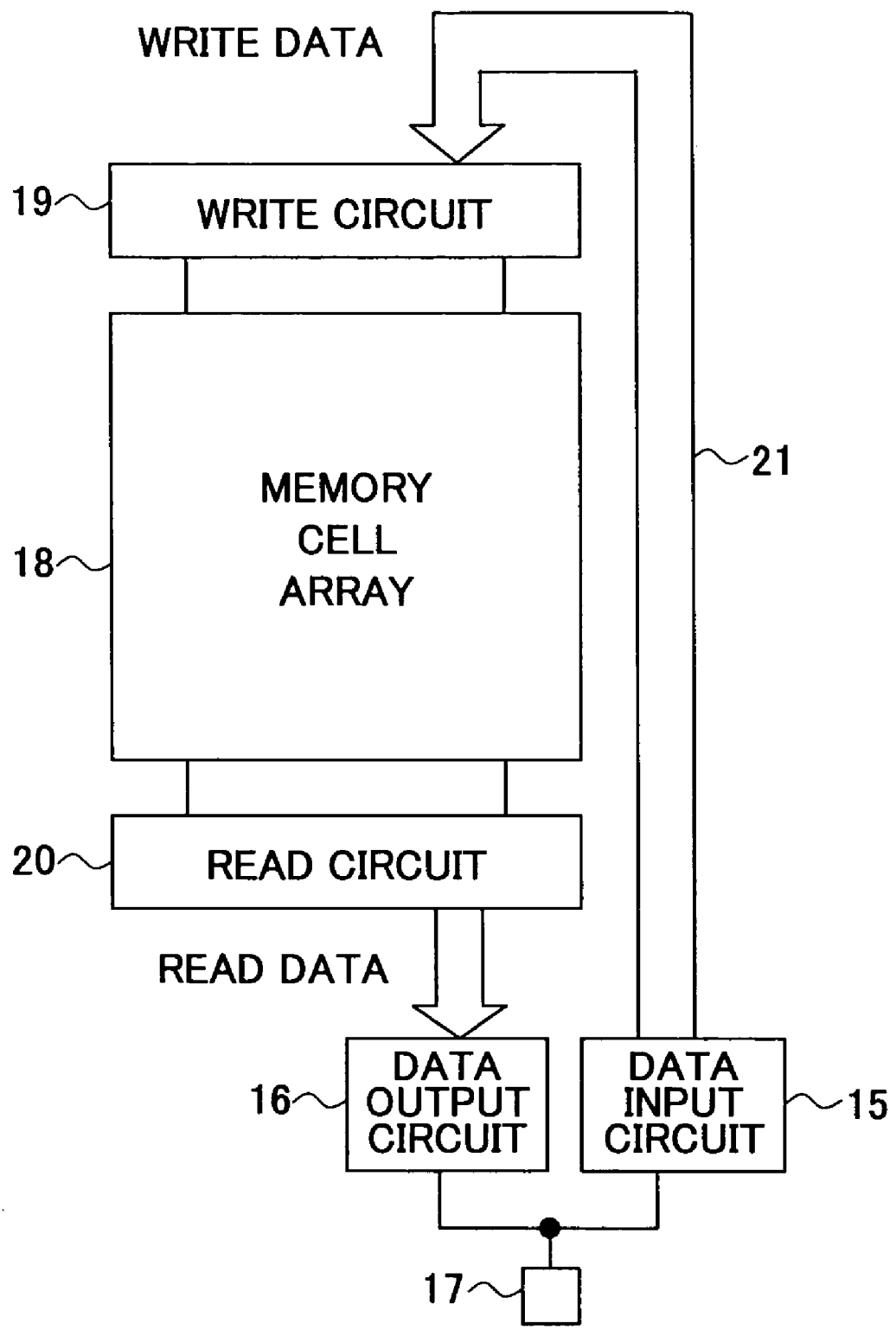
FIG. 4 is a block diagram showing an internal circuit of a semiconductor device that is used in a memory device according to a prior art example.

In the following, other advantages of implementing a cylinder shaped semiconductor chip 10 are described. FIG. 4 is a block diagram illustrating an internal circuit of a semiconductor chip that is used in a memory device according a prior art example. In the semiconductor device for a memory device according to the prior art, a data input circuit 15 and a data output circuit 16 may be connected to one electrode pad 17. Also, a write circuit 19 and a read circuit 20 may be provided at respective sides of a memory cell array 18. In such a case, if the data output circuit 16 is arranged close to the read circuit 20, the distance between the data input circuit and the write circuit 19 is increased, thereby increasing the length of a wiring 21 within the semiconductor chip for connecting these two circuits. In turn, a long wiring within the chip hinders high speed reading operations of the device.

On the other hand, in a semiconductor device according to an embodiment of the present invention, short wiring formed on the interposer may be used in place of the above-described wiring within the semiconductor chip of the prior art. Details of this feature are described below.

Figure 5:
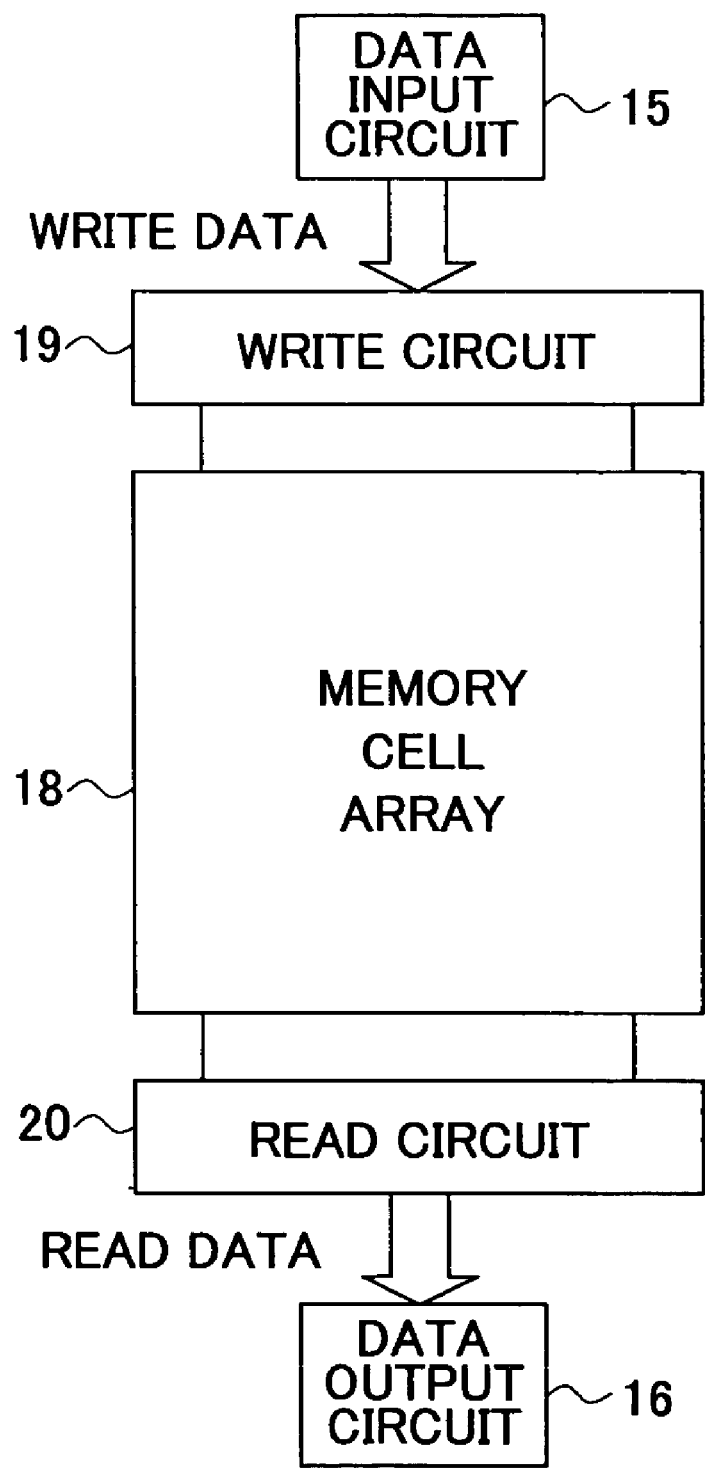
FIG. 5 is a block diagram showing an internal circuit of a cylinder shaped semiconductor device that is used as a memory device according to an embodiment of the present invention.
Figure 6:
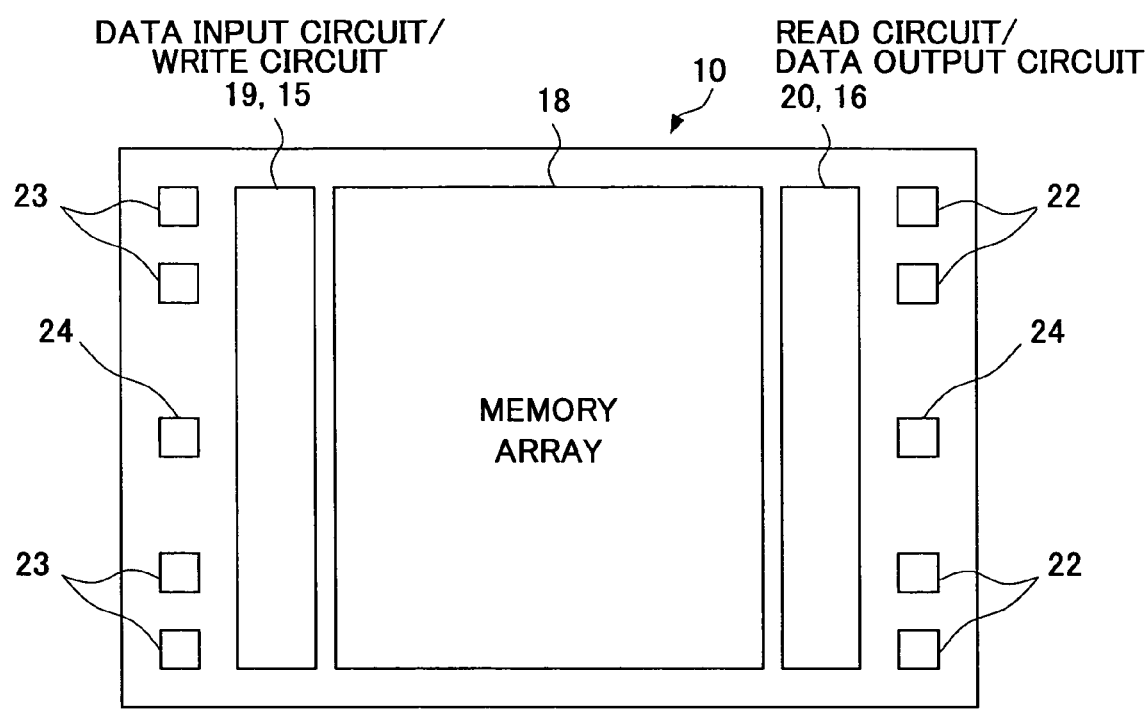
FIG. 6 is a diagram showing an internal configuration of a semiconductor chip that implements the circuit shown in FIG. 5.

FIG. 5 is a block diagram illustrating an internal circuit of the cylindrical semiconductor chip 10 that is used as a memory device according to an embodiment of the present invention. FIG. 6 is a diagram illustrating an internal configuration of the semiconductor chip 10 in a case where the circuit of FIG. 5 is implemented. In the present embodiment, the data input circuit 15 is arranged close to the write circuit 19, and the data output circuit 16 is arranged close to the read circuit 20. Data input terminals 22 are arranged close to the data output circuit 16 and the read circuit 20 in an aligned state. Data output terminals 23 are arranged close to the data input circuit 15 and the write circuit 19 in an aligned state.

The row of the data input terminals 22 corresponds to electrodes aligned at one side of the semiconductor chip 10, and the row of the data output terminals 23 corresponds to electrodes aligned at the other side of the semiconductor chip 10. Also, a clock (CLK) terminal 24 is included in each of the row of data input terminals 22 and the row of data output terminals 23.

Figure 7:
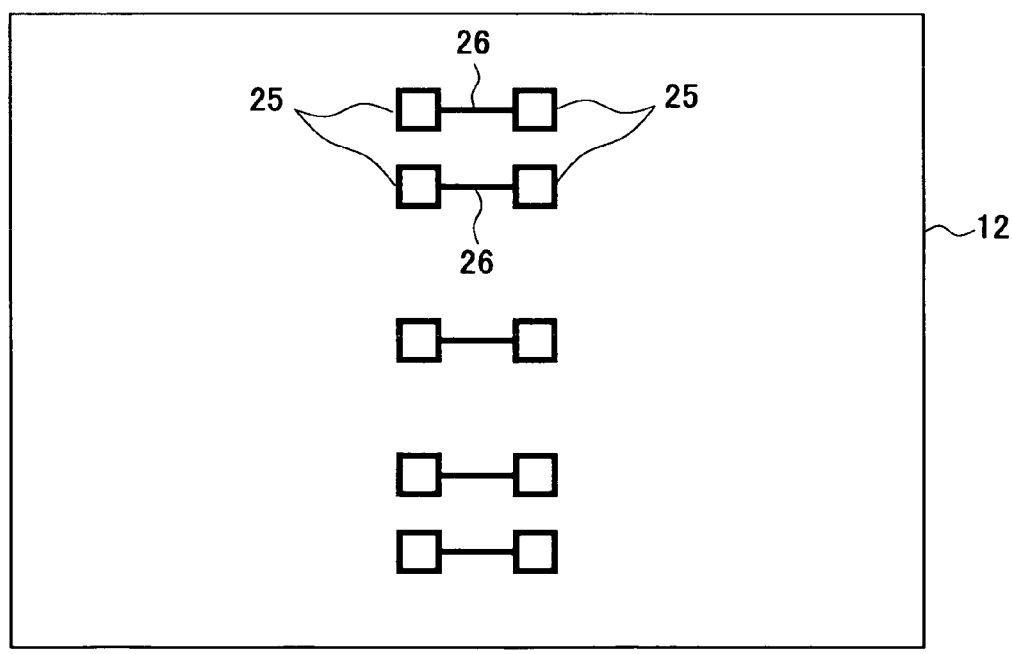
FIG. 7 is a plan view of an interposer for mounting the semiconductor chip shown in FIG. 6.

When the semiconductor chip 10 is deformed into a cylinder shape, the row of data input terminals 22 and the row of output terminals 23 close in on each other to form two parallel lines. The electrodes of the semiconductor chip 10 formed into such a configuration are connected to electrode pads 25 of the interposer 12 as is illustrated in FIG. 7, and thereby, data input terminals 22 and their corresponding data output terminals 23 may be interconnected by wiring 26 formed on the interposer 12.

In this way, in the present embodiment, short wiring may be used in place of the long wiring 21 (FIG. 4) formed in the semiconductor chip of the prior art so that a high speed operation may be realized.

In the following, methods of manufacturing a cylinder shaped semiconductor chip according to preferred embodiments of the present invention are described.

Figure 8:
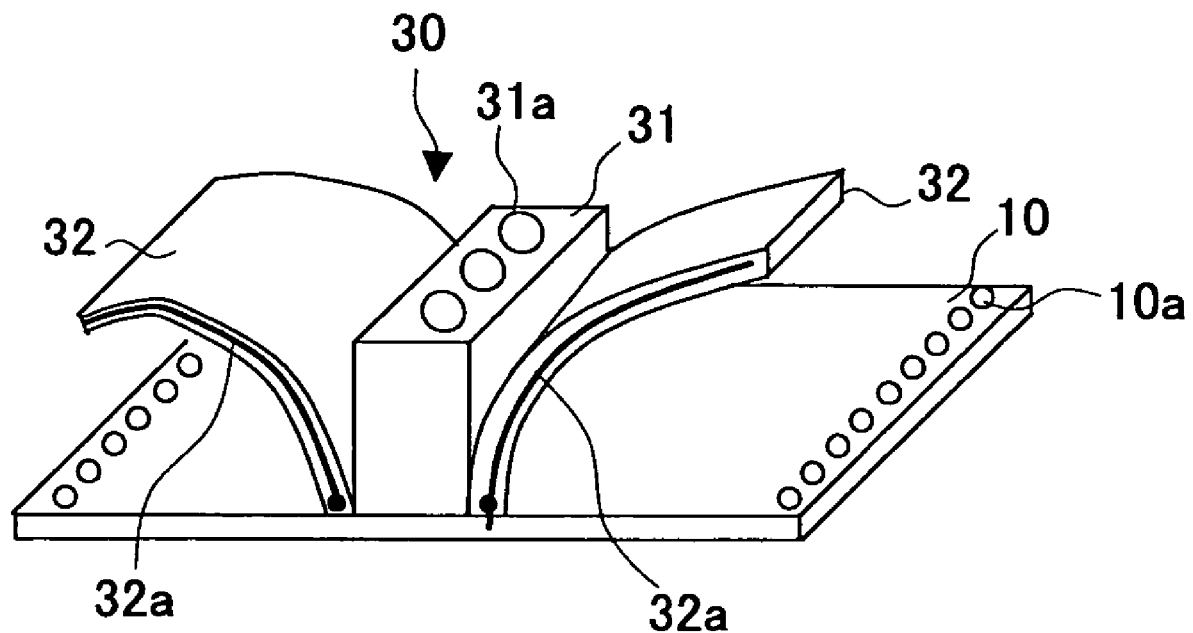
FIG. 8 is a perspective view of a deformation jig that is used to form a semiconductor chip into a cylinder shape.

FIG. 8 is a perspective view of a deformation jig for shaping a semiconductor chip into a cylinder shape that is used in a first method of forming a semiconductor chip. The deformation jig 30 shown in FIG. 8 includes a center support part 31 and arc-shaped movable parts 32 that are arranged at the sides of the support part 31 in a rotatable manner.

The support part 31 includes vacuum suction holes 31a that are configured to realize vacuum adhesion of the center portion of the semiconductor chip 10 when the semiconductor chip 10 is flat. Also, electro-thermal lines 32a are provided in the movable parts 32 in order to generate heat upon realizing deformation of the semiconductor chip with the deformation jig 30.

FIGS. 9A~9C illustrate the process of forming a semiconductor chip into a cylinder structure according to the first method. Referring to FIG. 9A, first, the surface of a flat semiconductor chip 10 on which the bumps 10a are mounted is adhered by vacuum suction to the support part 31. At this point, a coating material 11 is applied to the other side of the semiconductor chip 10. Then, as is shown in FIG. 9B, the movable parts 32 are rotated so that the semiconductor chip may gradually be deformed into the arc configuration of the movable parts 32. The movable parts 32 are rotated toward each other until the semiconductor chip 10 is formed into a substantially cylindrical configuration as is shown in FIG. 9C.

After the semiconductor chip 10 is formed into a substantially cylindrical configuration as is shown in FIG. 9C, the coating material 11 applied to the inner side of the semiconductor chip 10 is heat-cured by the electro-thermal lines 32a of the movable parts 32. After the heat-curing of the coating material 11 is completed, the movable parts 32 are moved back to their original positions, the vacuum adhesion is released, and the semiconductor chip 10 that is formed into a substantially cylindrical configuration is removed from the deformation jig 30. Herein, the cylindrical configuration of the semiconductor chip 10 may be maintained by the cured coating material 11.

It is noted that in some cases, the coating material 11 may alternatively be applied to the inner side of the semiconductor chip 10 and cured after the semiconductor chip 10 is deformed into a cylindrical configuration. Also, in another alternative example, the rotation of the moving parts 32 may be stopped before the semiconductor chip 10 is formed into a cylindrical configuration, and the coating material 11 may be applied to the inner side of the semiconductor chip 10 in an arched state, after which the coating material is hardened to form a semiconductor chip 10 with a curved configuration.

It is noted that although the coating material 11 is not limited to a particular material, quick dry liquid material such as epoxy resin may preferably be used. Also, since the semiconductor chip 10 is sealed by sealing resin 13, the coating material 11 is preferably made of resin that has a characteristic similar to that of the sealing resin 13 so that separation of the semiconductor package structure due to stress generated upon re-flow when mounting the semiconductor device may be prevented.

Also, the coating material 11 is preferably arranged to be thin in order to avoid disfiguration of the semiconductor chip 10 due to contraction of the coating material 11, for example. In this regard, the coating material 11 is preferably arranged to be thinner than the semiconductor chip 10, and may be arranged to be as thin as possible. Also, the temperature for heat-curing the coating material 11 is preferably arranged to be no more than 200° C. upon considering the effects on the semiconductor chip 10.

Also, depending on the characteristics of the coating material 11, the coating material 11 may be applied in a wafer state, and after deforming the semiconductor chip using the deformation jig 30, the coating material may be heated and set to a desired shape.

It is noted that in the present embodiment, the semiconductor chip is not wrapped around a cylinder substrate as in the prior art example; rather, the semiconductor chip is deformed into a cylinder shape without using a cylinder shaped member so that the weight of the semiconductor chip structure may be decreased. Also, the mounting structure of the semiconductor chip is not changed from that of the conventional semiconductor chip in which electrode pads of the semiconductor chip are wrapped around a cylinder shaped member, and thereby, a semiconductor chip with the conventional design may be used in the semiconductor device of the present invention. By setting the shape of the semiconductor chip using the coating material 11, the semiconductor chip 10 may be formed and set to an arbitrary shape, and the strength of the semiconductor chip 10 may be increased. Thereby, chip cracks may be prevented during a flip chip connection operation and/or a resin sealing operation, for example.

Figure 10A:
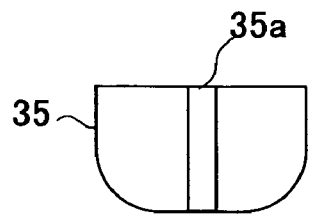
FIGS. 10A, 10B, and 10C are diagrams illustrating other types of deformation jigs that are used to form a semiconductor chip into a cylinder shape.
Figure 10B:
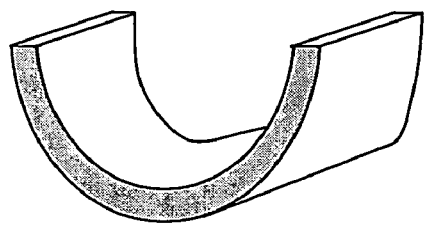
Figure 10C:
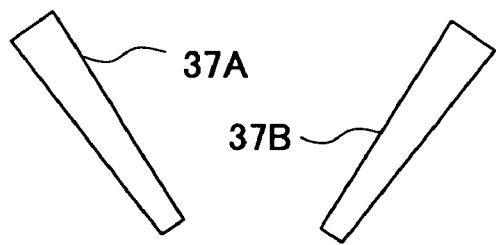

In the following, a second method for shaping the semiconductor chip into a cylinder structure is described. FIGS. 10A, 10B, and 10C are diagrams illustrating deformation jigs that are used in shaping a semiconductor chip into a cylinder structure according to the second method. FIGS. 11A~11E are diagrams illustrating the process of shaping the semiconductor chip into a cylinder structure according to the second method.

First, as is shown in FIG. 11A, the inner side of a semiconductor chip (i.e., the side of the semiconductor chip 10 opposite the side on which the bumps 10a are provided) is held in contact with a support jig 35 of FIG. 10A, and the semiconductor chip 10 is vacuum-adhered at holes 35a provided at the support jig 35. Then, as is shown in FIG. 11B, the semiconductor chip 10 that is supported by the support jig 35 is placed on a curved jig 36, and pressed into the curved jig 36 by the support jig 35. The curved jig 36 corresponds to a jig provided with elasticity that has a cross-sectional configuration close to a semi-circle. As the semiconductor chip 10 is pressed by the support jig 35, the semiconductor chip 10 is gradually deformed into a shape defined by the inner side of the curved jig 36 as is shown in FIG. 11C. In one embodiment, the shape of the semiconductor chip 10 defined by the inner side of the curved jig 36 may be maintained by providing vacuum adhesion means to the curved jig 36. Alternatively, an electro-thermal line may be provided in the curved jig 36 for heating the curved jig 36.

Then, as is shown in FIG. 11D, the support jig 35 is removed from the semiconductor chip 10, and the curved jig 36 is pushed at both sides by a push jig 37 (including parts 37A and 37B). In this way, the cross-sectional configuration of the curved jig 36 is deformed into a shape closer to a circle than a semi-circle. In this way, the semiconductor chip 10 arranged within the curved jig 36 may be deformed into a substantially cylindrical shape.

It is noted that in the present method, as in the first method, a coating material 11 may be applied to the semiconductor chip 10 when it is in a state as illustrated in FIG. 11D or FIG. 11E, and the coating material may be hardened thereafter so as to set the semiconductor chip 10 in a cylindrical shape.

In the following, examples of a semiconductor device implementing the semiconductor chip that is deformed into a cylinder shape are described.

Figure 12:
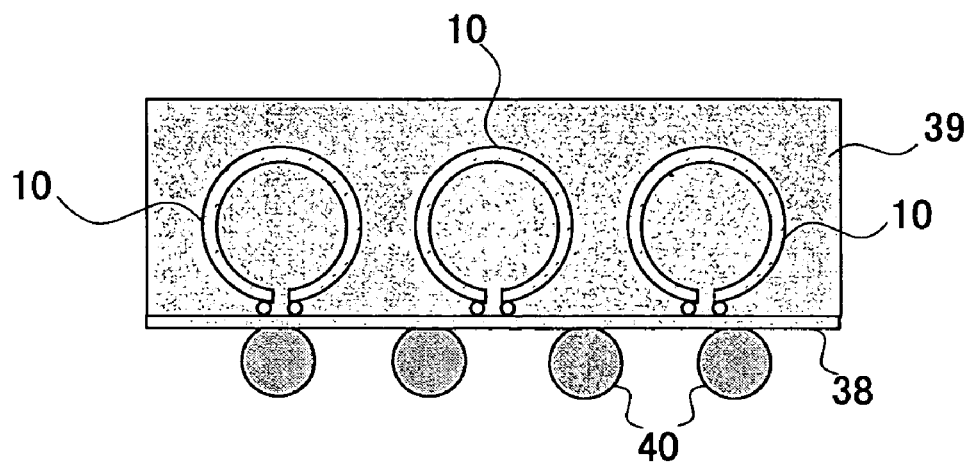
FIG. 12 is a cross-sectional view illustrating an example of a semiconductor device implementing plural cylinder shaped semiconductor chips.

FIG. 12 is a cross-sectional diagram illustrating one example of a semiconductor device that implements plural cylinder shaped semiconductor chips according to an embodiment of the present invention. In FIG. 12, three semiconductor chips 10 are flip chip connected to a package substrate (interposer) 38, and sealed thereto by a sealing resin 39. On the other side of the interposer 38, solder balls 40 are provided as external connection terminals. By using cylinder shaped semiconductor chips 10, the horizontal projected area of the semiconductor device may be reduced compared to a case of using the same number of flat semiconductor chips. Also, each of the plural semiconductor chips may be flip chip connected to the interposer 38.

Figure 13:
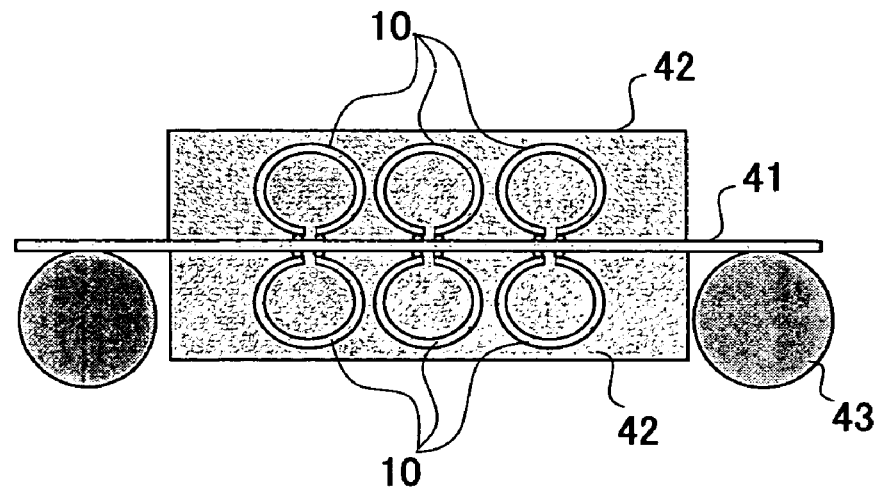
FIG. 13 is a cross-sectional view illustrating another example of a semiconductor device implementing plural cylinder shaped semiconductor chips.

FIG. 13 is a cross-sectional diagram showing another example of a semiconductor device that implements plural cylinder shaped semiconductor chips according to an embodiment of the present invention. In the example of FIG. 13, three semiconductor chips 10 are provided on each side of an interposer 41, that is, a total of six semiconductor chips are flip chip connected to the respective sides of the interposer 41 and sealed thereto by a sealing resin 42. Solder balls 43 as external connection terminals are provided at the outer sides of the sealing resin 43 provided on one side of the interposer 41, and the solder balls 43 are arranged to have a dimension that is greater than the thickness of the sealing resin 42. It is noted that semiconductor chips 10 shown in the example of FIG. 13 are slightly oval shaped, and in this way, the thickness of the sealing resin may be reduced.

Figure 14:
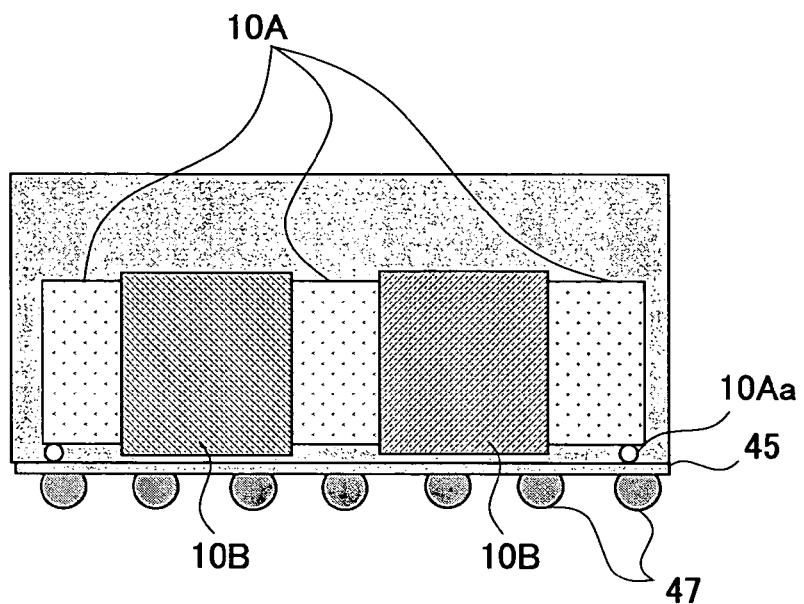
FIG. 14 is a cross-sectional view illustrating another example of a semiconductor device implementing plural cylinder shaped semiconductor chips.
Figure 15:
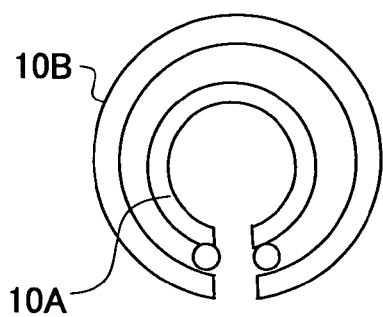
FIG. 15 is a cross-sectional view of a double-layered semiconductor chip structure implemented in the semiconductor device shown in FIG. 14.

FIG. 14 is a cross-sectional diagram showing another example of a semiconductor device that implements plural cylinder shaped semiconductor chips. In the example of FIG. 14, the semiconductor chips are arranged into a double layered cylinder structure. FIG. 15 is a cross-sectional view of the semiconductor chips shown in FIG. 14. As is shown in FIG. 15, a cylindrical semiconductor chip 10A is provided as an inner perimeter chip, and a cylindrical semiconductor chip 10B is provided on the periphery of the semiconductor chip 10A as an outer perimeter chip. In this way, plural semiconductor chips may be formed into an integrated structure. In the present example, the semiconductor chips 10A and 10B may be flip chip connected to the interposer 45 as a single semiconductor chip structure, and the semiconductor chips 10A and 10B may be sealed onto the interposer 45 by sealing resin 46. On the other side of the interposer 45, solder balls 47 as external connection terminals 47 are provided.

Figure 16:
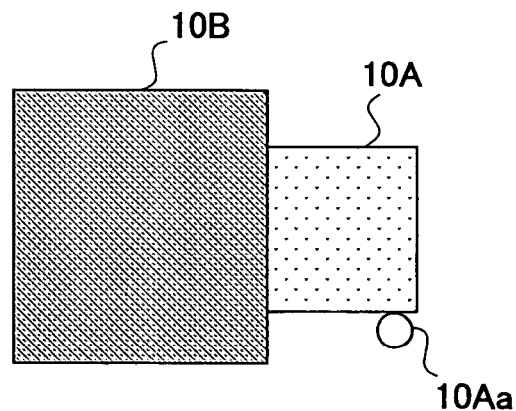
FIG. 16 is a side view showing an end portion of the double-layered cylinder shaped semiconductor chip structure.

FIG. 16 is a side view of an end portion of the double-layered cylindrical semiconductor chip structure. According to the present embodiment, the surface of the outer semiconductor chip 10B on which bumps are to be formed (circuit formation surface) faces the inner semiconductor chip 10A and corresponds to an inner perimeter surface of the cylinder structure. Thereby, external connection terminals cannot be formed on the outer semiconductor chip 10B. On the other hand, the surface of the inner semiconductor chip 10A on which bumps are to be formed (circuit formation surface) corresponds to an outer perimeter surface of the cylinder structure that faces outward. Thereby, the end portions of the inner semiconductor chip are arranged to protrude from the end portions of the outer semiconductor chip 10B, and bumps 10Aa as external connection terminals are provided at the outer surface of the end portions of the inner semiconductor chip 10A. The outer semiconductor chip 10B is connected to the interposer 45 via wiring within the inner semiconductor chip 10A and the bumps 10Aa.

By forming the semiconductor chips into a double-layered cylinder structure as is described above, plural semiconductor chips may be arranged within the semiconductor device in a spatially efficient manner, and the packaging density of the semiconductor chips may be increased.

Figure 17:
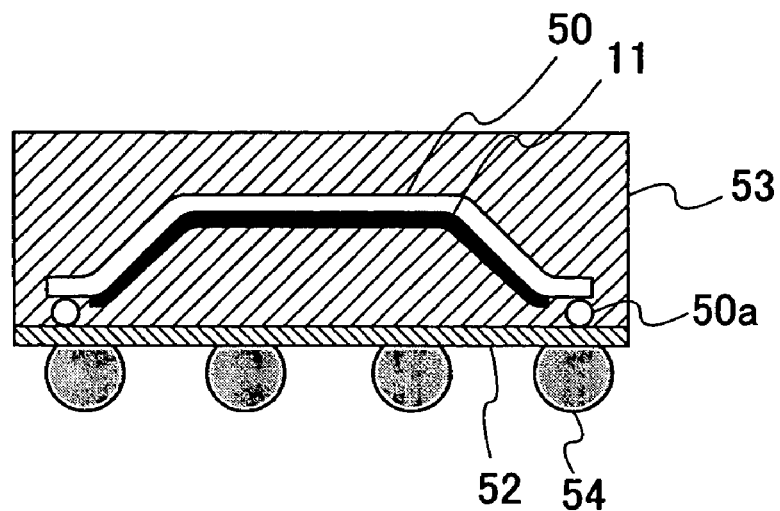
FIG. 17 is a cross-sectional view of a semiconductor device according to a second embodiment of the present invention.

In the following, a semiconductor device according to a second embodiment of the present invention is described. FIG. 17 is a cross-sectional diagram illustrating a configuration of a semiconductor device according to the second embodiment of the present invention. The semiconductor device shown in FIG. 17 includes a curved semiconductor chip 50. The semiconductor chip 50 is formed into a curved structure in a manner such that the surface of the semiconductor chip 50 that has bumps 50a formed thereon as external connection terminals (circuit formation surface) forms the inner side of the curved structure. The bumps 50a may be made of solder or gold, for example. A coating material 11 such as resin is applied to the circuit formation surface of the semiconductor chip 50, after which the coating material 11 is cured to form a resin layer.

The semiconductor chip 50 is connected to a package substrate (interposer) 52 via the bumps 50a. In other words, the bumps 50a of the semiconductor chip 50 provide flip chip connection to the interposer 52. The semiconductor chip 50 is sealed onto the interposer by a sealing resin 53. On the other side of the interposer 52, solder balls 54 are provided as external connection terminals of the semiconductor device.

In the case of bending the semiconductor chip 50 into a curved structure as is described above, a thin semiconductor chip is preferred. More specifically, the thickness of the semiconductor chip 50 is preferably arranged to be no more than 50 μm.

When a semiconductor chip has a curved structure like the semiconductor chip 50 described above, the size of the interposer may be reduced compared to the case of using a flat semiconductor chip. Thereby, the horizontal projected area of the semiconductor device may be reduced.

In the following, exemplary methods of shaping a semiconductor chip into a curved structure are described.

In one embodiment, the methods used to form the cylinder shaped semiconductor chip 10 according to the first embodiment may be used to form the curved semiconductor chip 50. For example, the deformation jig 30 shown in FIG. 8 may be used to form the curved semiconductor chip 50. In such a case, the semiconductor chip 50 in a flat state may be fixed to the support part 31, in a manner such that the chip surface to be held in contact with the support part 31 is reversed with respect to the case of forming the cylindrical semiconductor chip 10. In other words, the bumps 50a are arranged to face downward upon being fixed to the support part 31. Then, the rotation of the movable parts 32 is stopped in the state shown in FIG. 9B, and coating material 11 applied to the semiconductor chip is cured to set the semiconductor chip 50 into a curved shape.

The semiconductor chip 50 may also be formed by the deformation jigs 35 and 36 shown in FIGS. 10A and 10B. In such a case, the semiconductor chip 50 in a flat state may be fixed to the support part 31, in a manner such that the chip surface to be held in contact with the support part 31 is reversed with respect to the case of forming the cylindrical semiconductor chip 10, and the bumps 50a are arranged to face downward upon being fixed to the support part 35. Then, the coating material 11 is applied to the semiconductor chip 50 in the state shown in FIG. 11C, after which the coating material 11 is cured to form the semiconductor chip 50 that is set to a curved shape.

Figure 18:
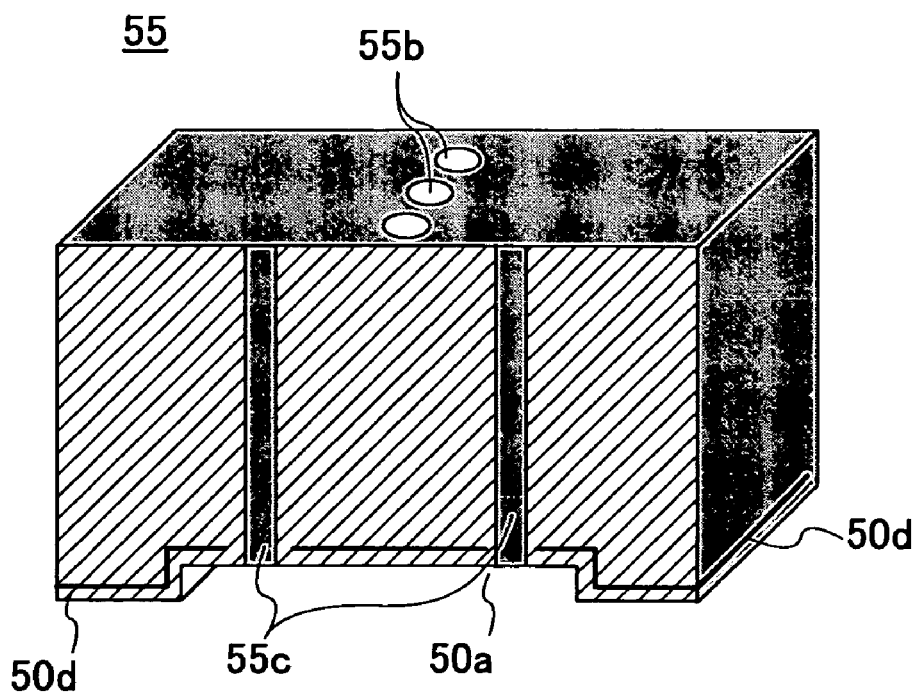
FIG. 18 is a cross-sectional perspective view of a deformation jig for shaping a semiconductor chip into a curved structure.

FIG. 18 is a cross-sectional perspective view of a deformation jig for forming a curved semiconductor chip. The deformation jig 55 shown in FIG. 18 corresponds to a block-shaped jig that has a concave portion 55a that forms a space at the center portion of its bottom section. This jig 55 includes vacuum suction holes 55b that open through the center of this space formed at the bottom section. Also, an injection path 55c for injecting a coating material 56 (see FIG. 19) opens through this space at the bottom section. Further, an electro-thermal line 50d for heating the jig is embedded close to the bottom section.

Figure 19A:
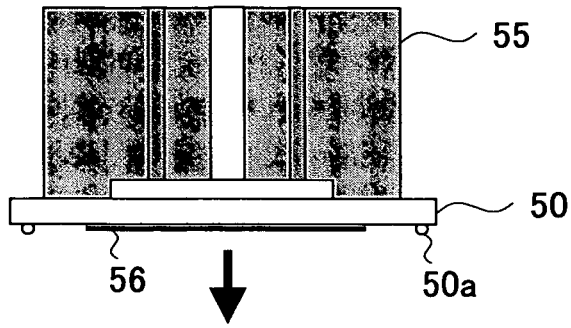
FIGS. 19A, 19B, and 19C are diagrams illustrating a process of shaping a semiconductor chip into a curved structure using the deformation jig shown in FIG. 18.
Figure 19B:
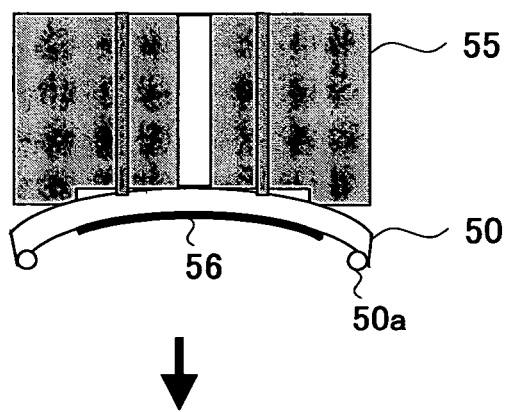
Figure 19C:
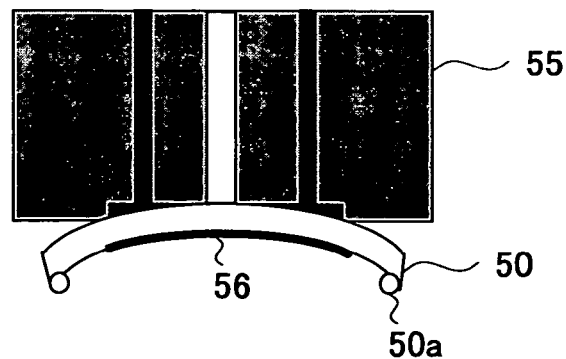

According to a method of forming the semiconductor chip 50 using the deformation jig 55 of FIG. 18, first, the back surface (opposite the circuit formation surface) of a flat-shaped semiconductor chip 50 is placed at the bottom section of the deformation jig 55 as is shown in FIG. 19A. Herein, the space created by the concave portion 55a of the jig 55 is arranged to be positioned at the center portion of the semiconductor chip 50. Also, the coating material 56 is applied to the circuit formation surface of the semiconductor chip 50. Then, the semiconductor chip 50 is vacuum-adhered via the vacuum suction holes 55b so that the semiconductor chip 50 may be deformed into a curved structure as is shown in FIG. 19B. Then, the coating material 56 is injected from the injection path 55c to be placed between the semiconductor chip 50 and the bottom surface of the concave portion of the deformation jig 55, after which the coating material 56 is heated by the electro-thermal line 50d and cured. In this way, the semiconductor chip 50 may be set to a curved shape by the coating material 56 placed on the circuit formation surface side of the semiconductor chip 50 and on the opposite side thereof.

Figure 20:
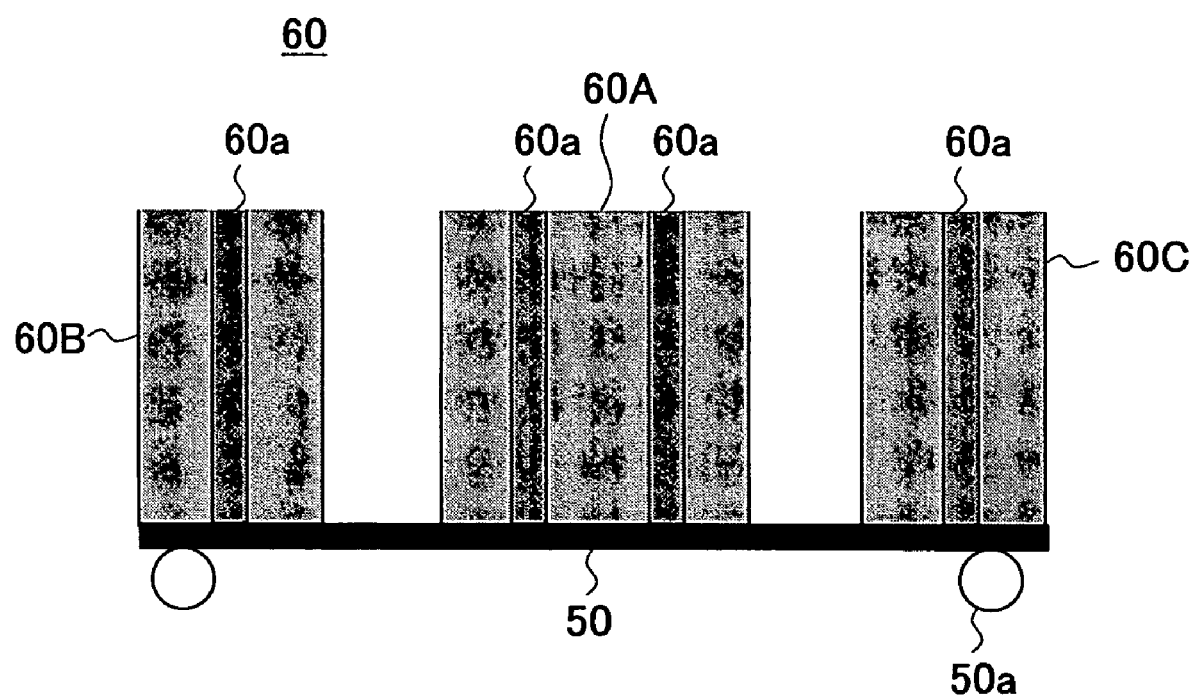
FIG. 20 is a cross-sectional view of another deformation jig for shaping a semiconductor device into a curved structure.

FIG. 20 is a cross-sectional view of another deformation jig for forming a curved semiconductor chip. The deformation jig 60 shown in FIG. 20 includes a center support portion 60A for supporting the center portion of the semiconductor chip 50, and edge support portions 60B and 60C for supporting the respective edges of the semiconductor chip 50. The center support portion 60A and the edge support portions 60B and 60C are arranged to adhere a flat shaped semiconductor chip 50 via vacuum suction holes 60a. FIG. 20 shows a state in which the flat shaped semiconductor chip 50 is adhered to the deformation jig 60.

Figure 21A:
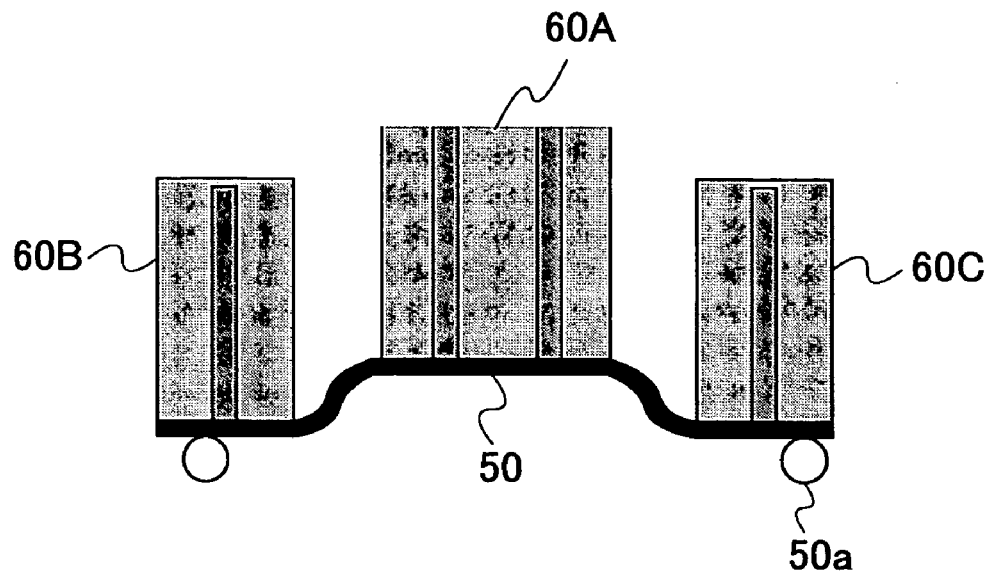
FIGS. 21A and 21B are diagrams illustrating a process of shaping a semiconductor chip into a curved structure using the deformation jig shown in FIG. 20.

In the present example, the center support portion 60A is arranged to move with respect to the edge support portions 60B and 60C so that the semiconductor chip 50 is deformed into a curved shape as is shown in FIG. 21A from the state shown in FIG. 20. In this way, the semiconductor chip 50 may be formed into a curved shape by deforming the portions in between the center portion and the edge portions of the semiconductor chip 50 while retaining the flat configurations of the center portion and the edge portions that are supported by the center support portion 60A and the edge support portions 60B and 60C.

Figure 21B:
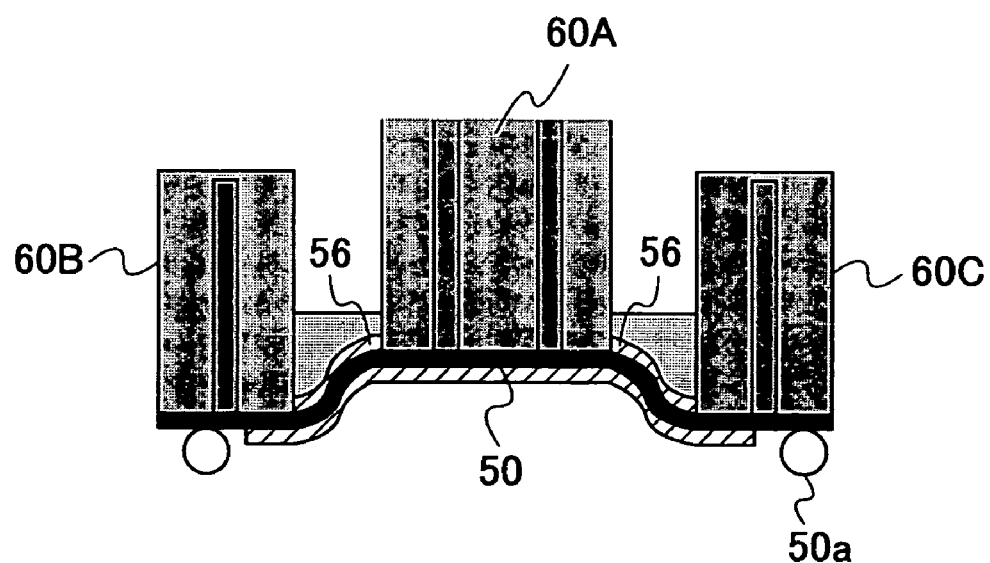

Then, the coating material 56 is applied to the circuit formation surface side and the other side of the semiconductor chip 50 and cured thereafter (see FIG. 21B). In this way, the semiconductor chip 50 may be set to a curved shape.

Figure 22:
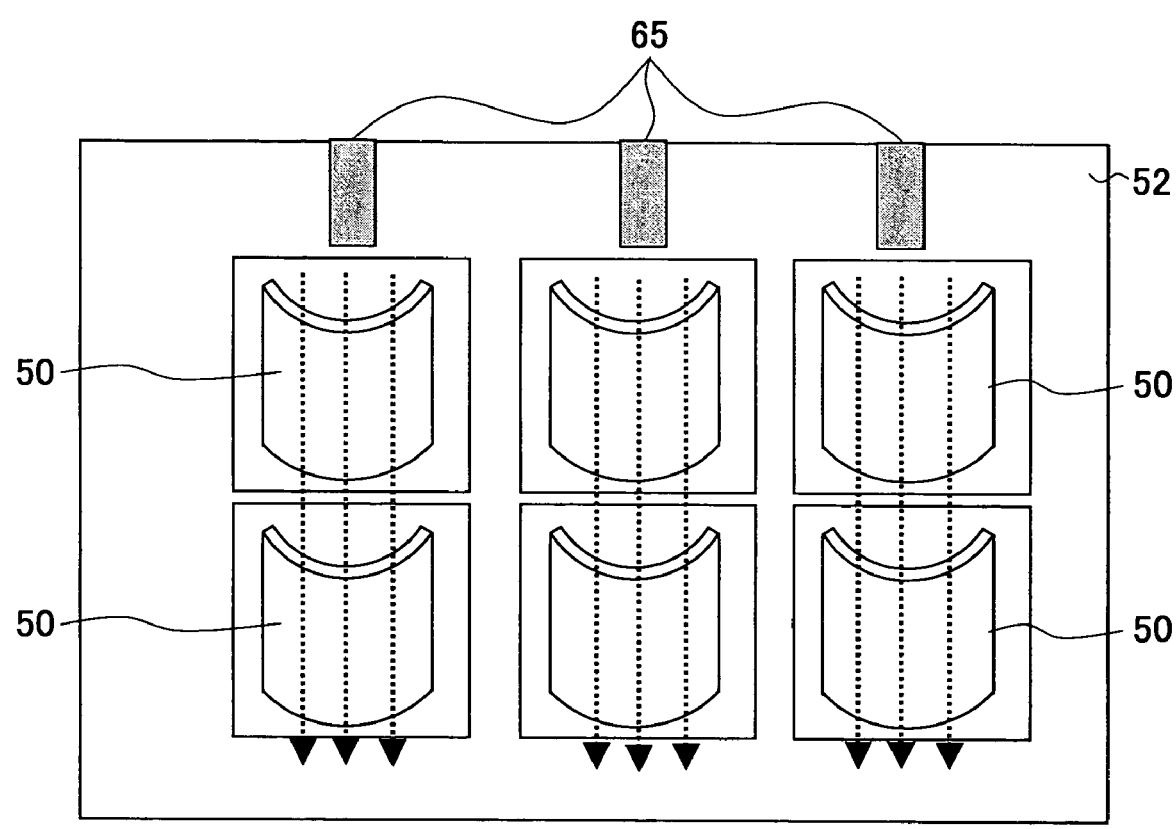
FIG. 22 is a diagram illustrating the flow of sealing resin in a process of sealing plural curved semiconductor chips.

In a case of mounting plural semiconductor chips 50 of the present embodiment on an interposer 52 (see FIG. 22), the semiconductor chips 50 are preferably arranged in a manner such that the extending direction of the space openings formed by the curved structures of the semiconductor chips 50 are in alignment with the flowing direction of the sealing resin, which is indicated by arrows in the present drawing. Specifically, the positions of gates 65 for injecting the sealing resin are adjusted so that the sealing resin may easily flow and fill into the spaces created by the semiconductor chips 50 and the interposer 52. Such an arrangement may also be applied to a case in which the cylindrical semiconductor chips 10 of the first embodiment are used.

In the following, a semiconductor device that implements plural curved semiconductor chips that are arranged into a package is described.

Figure 23:
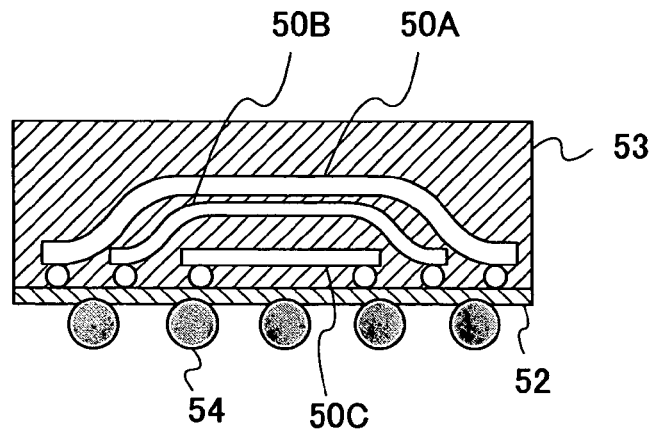
FIG. 23 is a cross-sectional view of a semiconductor device in which a smaller-sized semiconductor chip is arranged to be accommodated within a space created by the curved structure of a larger-sized semiconductor chip.

FIG. 23 is a cross-sectional view of a semiconductor device having a configuration in which a smaller-sized semiconductor chip is accommodated within a space created by the curved shape of a larger-sized semiconductor chip. In the example of FIG. 23, a large semiconductor chip 50A is formed into a curved structure, and a smaller-sized semiconductor chip 50B that is also formed into a curved structure is placed inside the curvature of the semiconductor chip 50A. Further an even smaller-sized semiconductor chip 50C that is flat-shaped in placed within the curvature of the semiconductor chip 50B. In the present example, each of the semiconductor chips 50A, 50B, and 50C is flip chip connected to the interposer 52 and is sealed thereto by a sealing resin 53.

Figure 24:
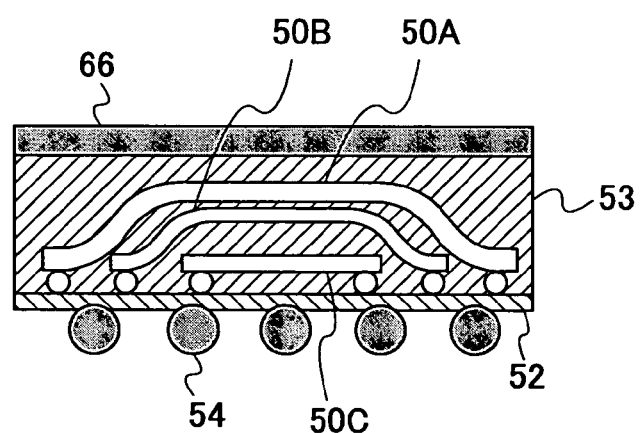
FIG. 24 is a cross-sectional diagram of the semiconductor device of FIG. 23 implementing a heat sink.

The arrangement shown in FIG. 23 is quite similar to a layered semiconductor chip structure; however, in this example, each of the semiconductor chips may be flip chip connected to the interposer 52. Also, in a case where heat generation may be a problem due to the increase in the packaging density of the semiconductor chips, a heat sink 66 may be provided on the upper surface of the sealing resin 53 as is shown in FIG. 24.

In a multi-layer semiconductor chip arrangement such as that shown in FIG. 23, the semiconductor chips may be mounted starting with the smallest semiconductor chip, and the semiconductor chips may be collectively deformed thereafter to realize the flip chip connection of the semiconductor chips at once. In this way, the manufacturing process steps may be reduced. However, since such method may cause a degradation in the connection accuracy between the interposer and the semiconductor chips, and may also result in an increase in the thickness of the semiconductor chips to thereby hinder the deformation of the semiconductor chips, it is preferred that the semiconductor chips be deformed and flip chip connected individually.

Figure 25:
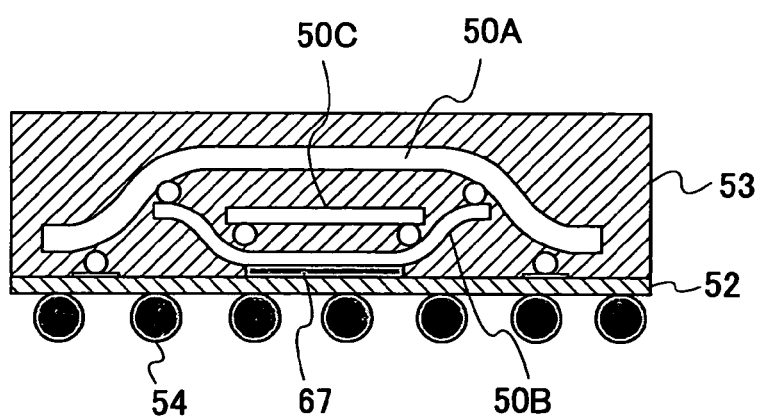
FIG. 25 is a cross-sectional diagram showing another configuration of a semiconductor device in which a smaller-sized semiconductor chip is arranged to be accommodated within a space created by the curved structure of a larger-sized semiconductor chip.

FIG. 25 is a cross-sectional view of another exemplary semiconductor device having a configuration in which a smaller-sized semiconductor chip is accommodated within a space created by the curved shape of a larger-sized semiconductor chip. In the semiconductor device of FIG. 25, the semiconductor chip 50B is positioned upside down so as to be flip chip connected to the semiconductor chip 50A. The semiconductor chip 50C is arranged inside a space created between the semiconductor chip 50A and the semiconductor chip 50B. In the example shown in FIG. 25, the semiconductor chip 50C is flip chip connected to the semiconductor chip 50B.

Figure 26:
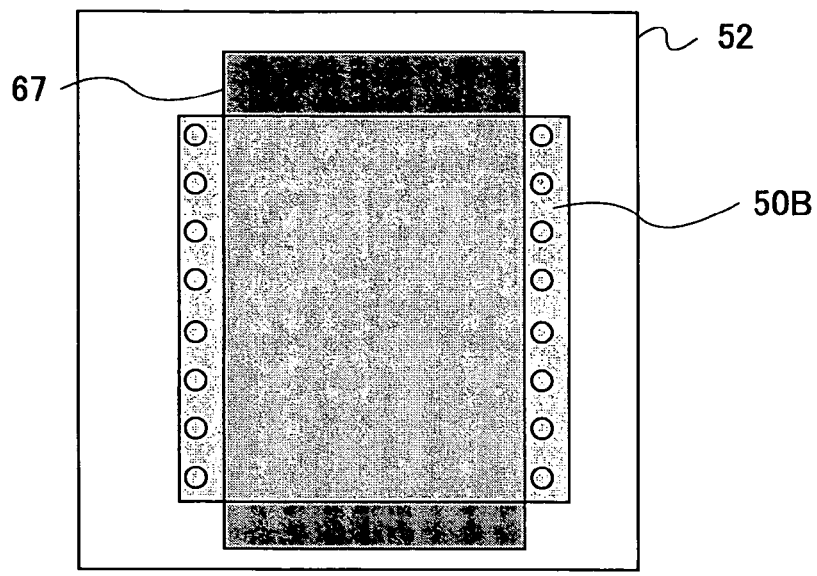
FIG. 26 is a plan view of a solid wiring layer of the semiconductor device of FIG. 25.
Figure 27:
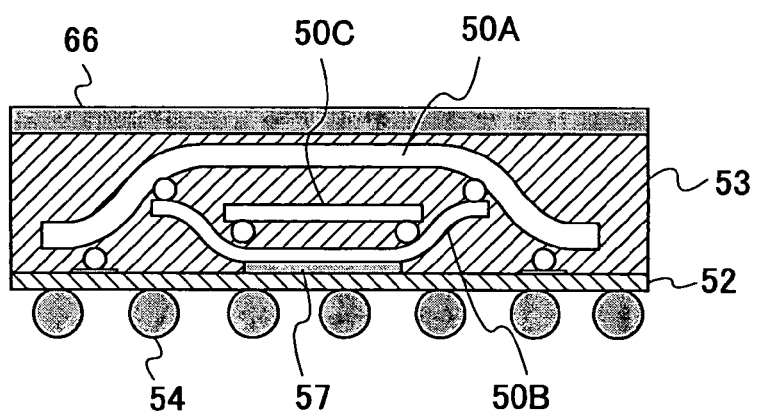
FIG. 27 is a cross-sectional view of the semiconductor device of FIG. 25 implementing a heat sink.

In the arrangement shown in FIG. 25, the back side (opposite the circuit formation surface) of the semiconductor chip 50B is arranged to face the interposer 52, thereby, a solid wiring layer 67 such as a copper layer may be formed on the interposer 52 as is shown in FIG. 26 so that heat transfer from the semiconductor chip 50B may be increased. Also, a heat sink 66 made of a metal plate, for example, may be provided on the upper surface of the sealing resin 53 as is shown in FIG. 27 to further increase heat transfer. Other alternative measures may also be taken to increase heat transfer, including the introduction of thermal balls, and/or the use of a sealing resin with good heat transfer characteristics to reduce heat transfer resistance.

In the semiconductor device of FIG. 25, the semiconductor chips are flip chip connected to each other. In this way the length of the connection wiring between the chips may be shortened and high speed operation may be realized.

Figure 28:
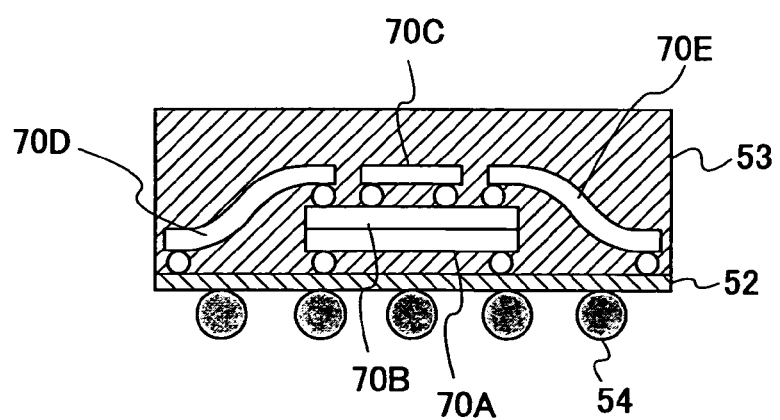
FIG. 28 is a cross-sectional diagram showing another configuration of a semiconductor device that implements plural curved semiconductor chips.

FIG. 28 is a cross-sectional view of another exemplary semiconductor device that implements plural semiconductor chips. In this example, plural flat semiconductor chips are connected to the interposer 52, and the uppermost semiconductor chip is connected to the interposer by being deformed. Specifically, in FIG. 28, semiconductor chips 70A and 70B are layered in a manner such that their respective back surfaces face each other, and the semiconductor chip 70A is flip chip connected to the interposer 52. The semiconductor chip 70B is arranged so that its circuit formation surface faces upward.

In the present example, the semiconductor chip 70B is further flip chip connected with a semiconductor chip 70C. It is noted that in a conventional MCP (multi-chip package), a semiconductor chip and an interposer are generally connected via a bonding wire; however, in the present example shown in FIG. 28, deformed semiconductor chips 70D and 70E are used instead of a bonding wire.

In such an arrangement, the semiconductor chips 70D and 70E that are used for connecting the multi-layered semiconductor chip structure to the interposer 52 may be suitably deformed into a desired shape so that the thickness of the multi-layered semiconductor chip structure may not be restricted. Also, even in a case where a large number of electrode pads are provided, and/or a large number of semiconductor chips are mounted, connection of the semiconductor chips may be integrally realized by using the deformed chip to establish flip chip connection between the uppermost semiconductor chip and the interposer so that the electrode pads of each of the semiconductor chips do not have to be individually connected. Accordingly, connection between the semiconductor chips and the interposer may be realized in a short period of time.

It is noted that the type of semiconductor chip used as the uppermost semiconductor chip 70C and the semiconductor chips 70D and 70E for realizing connection with the lower semiconductor chips is not limited to a particular type of semiconductor chip, and for example, a semiconductor chip including a semiconductor circuit may be used, or a semiconductor chip that merely includes wiring patterns may be used as well.

Figure 29:
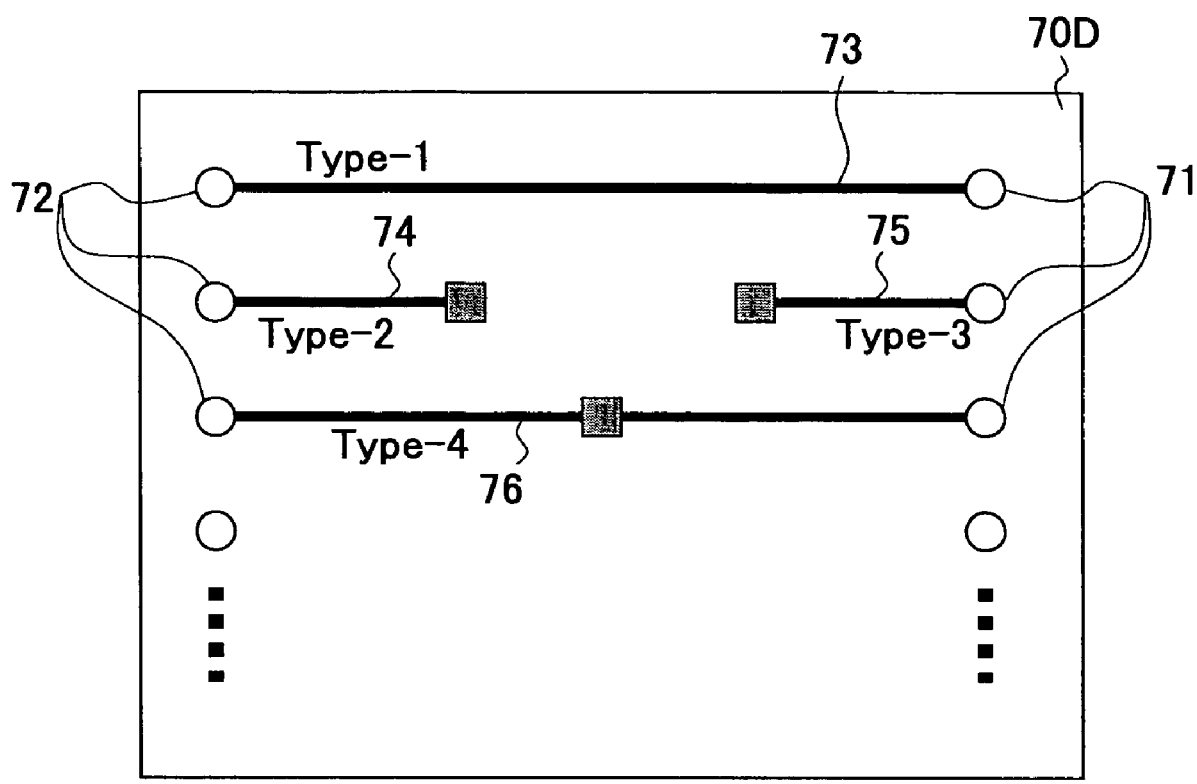
FIG. 29 is a plan view showing an exemplary configuration of wiring of a semiconductor chip provided in the semiconductor device of FIG. 28.

FIG. 29 is a plan view showing an exemplary wiring arrangement of the semiconductor chip 70D. In this example, electrode pads 71 to be connected to electrode pads of the semiconductor chip 70B are arranged into a row on one side edge of the semiconductor chip 70D, and electrode pads 72 to be connected to electrode pads of the interposer 52 are arranged into a row on the other side edge of the semiconductor chip 70D.

In this drawing, pattern wiring 73 connects the electrode pad 71 to an electrode pad 72 to thereby connect the semiconductor chip 70B to the interposer 52. Pattern wiring 74 connects a circuit within the semiconductor chip 70D to the interposer 52. Pattern wiring 75 connects a circuit within the semiconductor chip 70D to the semiconductor chip 70B. Pattern wiring 76 interconnects the semiconductor chip 70B, the semiconductor chip 70D, and the interposer 52 simultaneously.

By using a deformed semiconductor chip instead of a bonding wire, plural electrode pads may be connected at once and various wiring paths may be easily formed.

Figure 30A:
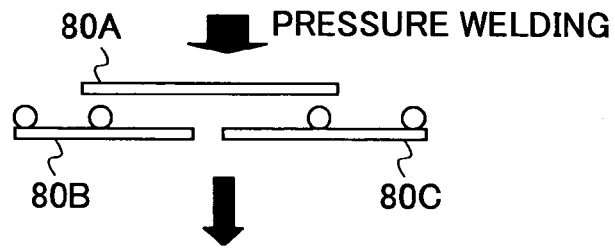
FIGS. 30A~30D are diagrams illustrating a process of integrally deforming plural semiconductor chips to manufacture a semiconductor device according to an embodiment of the present invention.
Figure 30B:
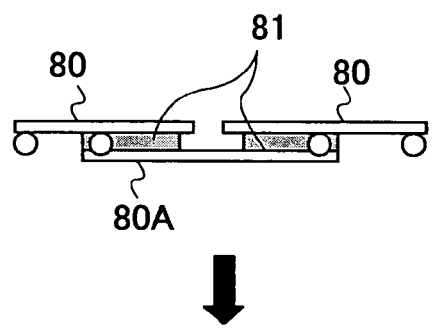
Figure 30C:
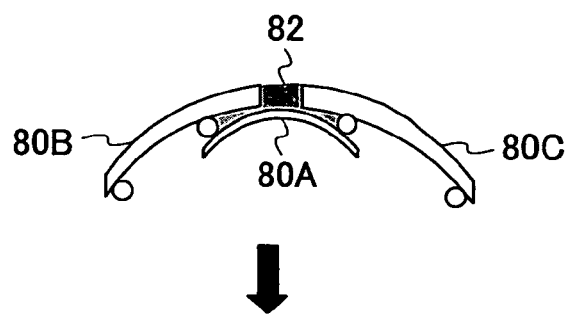
Figure 30D:
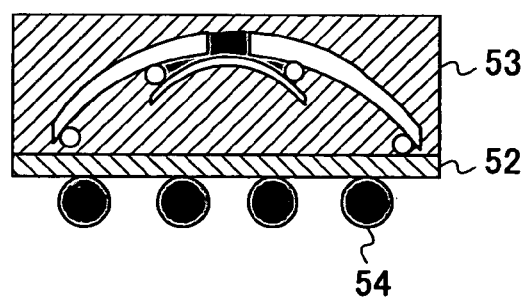

FIGS. 30A~30D are diagrams illustrating the process of forming a semiconductor device by collectively deforming plural semiconductor chips at once. First, plural semiconductor chips 80A, 80B, and 80C are flip chip connected to each other as is shown in FIG. 30A, and an underfill material 81 is placed in between the semiconductor chips to set the semiconductor chips as is shown in FIG. 30B. Then, the set semiconductor chip structure of semiconductor chips 80A, 80B, and 80C is integrally deformed (bent) using one of the above-described deformation methods, for example, after which resin 82 as a setting member is placed in the space created between the semiconductor chips 80A, 80B, and 80C to be cured thereat as is shown in FIG. 30C. Then, the deformed semiconductor chip structure of semiconductor chips 80A, 80B, and 80C is flip chip connected to the interposer 52 and sealed thereon by a sealing resin 53 as is shown in FIG. 30D.

According to the above-described deformation method, plural semiconductor chips may be integrally deformed. Also, deformation of a small semiconductor chip (e.g., semiconductor chip 80A) that cannot be easily deformed on its own may be realized using the present method.

It is noted that although in the present example as illustrated in FIGS. 30A~30D, three semiconductor chips are implemented, the present invention is not limited to such arrangement, and for example, the semiconductor chips 80B and 80C may be arranged into one single semiconductor chip.

Further, the present invention is not limited to the specific embodiments described above, and variations and modifications may be made without departing from the scope of the present invention.

What is claimed is:

1. A semiconductor device, comprising:
at least one semiconductor chip;
a setting member that is formed on a surface of the semiconductor chip and is configured to set the semiconductor chip into a deformed shape corresponding to one of a substantially cylinder shape and a curved shape;
a package substrate to which the deformed semiconductor chip is flip chip connected;
a sealing resin that seals the semiconductor chip onto the package substrate: and
an external connection terminal that is provided on the package substrate wherein the deformed semiconductor chip is flip chip connected only at outer edges of said semiconductor chip.

2. The semiconductor device as claimed in claim 1, wherein the setting member corresponds to a resin layer that is formed on an inner side surface of the substantially cylinder shaped or curve shaped semiconductor chip.

* * * * *